US012562230B2

(12) United States Patent
Tseng

(10) Patent No.: US 12,562,230 B2
(45) Date of Patent: Feb. 24, 2026

(54) MEMORY DEVICE WITH HIGH CONTENT DENSITY AND ENCODING METHOD THEREOF

(71) Applicant: MACRONIX INTERNATIONAL CO., LTD., Hsinchu (TW)

(72) Inventor: Po-Hao Tseng, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 150 days.

(21) Appl. No.: 18/744,776

(22) Filed: Jun. 17, 2024

(65) Prior Publication Data

US 2024/0339162 A1     Oct. 10, 2024

Related U.S. Application Data

(62) Division of application No. 17/686,469, filed on Mar. 4, 2022, now Pat. No. 12,057,179.

(51) Int. Cl.
| | |
|---|---|
| *G11C 16/34* | (2006.01) |
| *G11C 16/08* | (2006.01) |
| *G11C 16/10* | (2006.01) |
| *G11C 16/26* | (2006.01) |
| *G11C 16/30* | (2006.01) |

(52) U.S. Cl.
CPC .......... *G11C 16/3404* (2013.01); *G11C 16/08* (2013.01); *G11C 16/102* (2013.01); *G11C 16/26* (2013.01); *G11C 16/30* (2013.01)

(58) Field of Classification Search
CPC ... G11C 16/3404; G11C 16/08; G11C 16/102;
G11C 16/26; G11C 16/30; G11C 16/10;
G11C 16/24; G11C 16/0483; G11C
16/32; G11C 16/06; G11C 7/1006; G11C
15/046
See application file for complete search history.

(56) References Cited

U.S. PATENT DOCUMENTS

| | | | |
|---|---|---|---|
| 2014/0347933 A1 | 11/2014 | Lee | |
| 2015/0003164 A1 | 1/2015 | Roohparvar | |
| 2019/0392874 A1 | 12/2019 | Yabe | |
| 2020/0211640 A1 | 7/2020 | Sharon | |
| 2021/0280250 A1 | 9/2021 | Advani | |

FOREIGN PATENT DOCUMENTS

JP          6834335 B2 *   2/2021

* cited by examiner

*Primary Examiner* — Sultana Begum
(74) *Attorney, Agent, or Firm* — McClure, Qualey & Rodack, LLP

(57)          ABSTRACT

An encoding method is provided for a memory device which includes an in-memory search (IMS) array having several memory units. The memory units in a same horizontal row are coupled to a first driving circuit through corresponding word lines and coupled to a sensing circuit through a match signal line. Every 2N adjacent memory units in the same horizontal row are arranged as a memory cell. An original data of M-bits is encoded to an encoded data of 2N-bits with a first encoded area including the first to N-th bits of the encoded data and a second encoded area including the (N+1)-th to 2N-th bits of the encoded data. The M bits of the original data have an equivalent binary value increased by an incremental step which is P times of an incremental step for the N bits of the first encoded area.

16 Claims, 14 Drawing Sheets

MEMORY DEVICE WITH HIGH CONTENT DENSITY AND ENCODING METHOD THEREOF

This application is a divisional application of U.S. application Ser. No. 17/686,469 filed at Mar. 4, 2022, the subject matter of which is incorporated herein by reference.

TECHNICAL FIELD

The present disclosure relates to a semiconductor device, and more particularly, relates to a memory device capable of storing data with high content density and an encoding method for the memory device.

BACKGROUND

In artificial intelligence (AI) algorithms, mass of data comparisons and data searches need to be performed. In order to meet the computational requirements of mass data comparisons/searches, ternary content addressable memory (TCAM) is employed in prior arts to perform highly parallel searches.

The conventional TCAM memory in prior arts employs types of memories, e.g., static random access memory (SRAM), 2T2R structure resistive memory (RRAM) and ferroelectric random access memory (FeRAM), etc. However, when the above types of TCAM memory are applied to parallel-search operations, the performance of power consumption and on/off ratio is still not ideal, so that it is difficult to distinguish the all-match case from the one-bit mismatch when performing data-comparison. In addition, the conventional TCAM memory has lower density of storage content, which is insufficient for data-search of a large amount of contents.

In view of the above, skilled ones in the related industries of the technical field are devoted to improving the data configuration of the TCAM memory and encoding the original data of the TCAM memory, which may effectively improve the density of the stored content of the TCAM memory.

SUMMARY

According to one aspect of the disclosure, a memory device is disclosed. The memory device comprises a first driving circuit, a sensing circuit and an in-memory search (IMS) array. The IMS array includes a plurality of memory units, the memory units are arranged as a plurality of horizontal rows and a plurality of vertical columns, and a respective control terminal of each of the memory units in the same horizontal row is coupled to the first driving circuit through a corresponding word line, the memory units in the same horizontal row are coupled to the sensing circuit through a match signal line. Every 2N adjacent memory units in the same horizontal row are arranged as a memory cell, the 2N memory units in the memory cell are programmed to have a first threshold voltage or a second threshold voltage to represent an encoded data of 2N-bits which are encoded from an original data of M-bits, and M is equal to 2(N−1), where N and M are positive integers greater than or equal to two. The encoded data has a first encoded area including the first to N-th bits of the encoded data and a second encoded area including the (N+1)-th to 2N-th bits of the encoded data, and the M bits of the original data have an equivalent binary value increased by an incremental step which is P times of an incremental step for the N bits of the first encoded area, where P is a positive integer greater than or equal to two.

According to another aspect of the disclosure, an encoding method for a memory device is disclosed. The memory device includes a first driving circuit, a sensing circuit and an in-memory search (IMS) array, the IMS array includes a plurality of memory units arranged as a plurality of horizontal rows and a plurality of vertical columns, a respective control terminal of each of the memory units in the same horizontal row is coupled to the first driving circuit through a corresponding word line, and the memory units in the same horizontal row are coupled to the sensing circuit through a match signal line, wherein every 2N adjacent memory units in the same horizontal row are arranged as a memory cell, and the encoding method comprises the following steps. An original data of M-bits is encoded to an encoded data of 2N-bits with a first encoded area and a second encoded area, the first encoded area includes the first to N-th bits of the encoded data, and the second encoded area includes the (N+1)-th to 2N-th bits of the encoded data, wherein the M bits of the original data have an equivalent binary value increased by an incremental step which is P times of an incremental step for the N bits of the first encoded area, and wherein N, M and P are positive integers greater than or equal to two, and M is equal to 2(N−1). The 2N adjacent memory units in the memory cell are programmed to have a first threshold voltage or a second threshold voltage to represent the encoded data.

With the above technical solution, the original data of the TCAM memory is encoded to improve the density of the stored content of the TCAM memory. It may be applied to NAND-type or NOR-type memory and cooperates with corresponding encoded data configuration and search data configuration to effectively perform parallel data comparison and data search.

Figure 1:
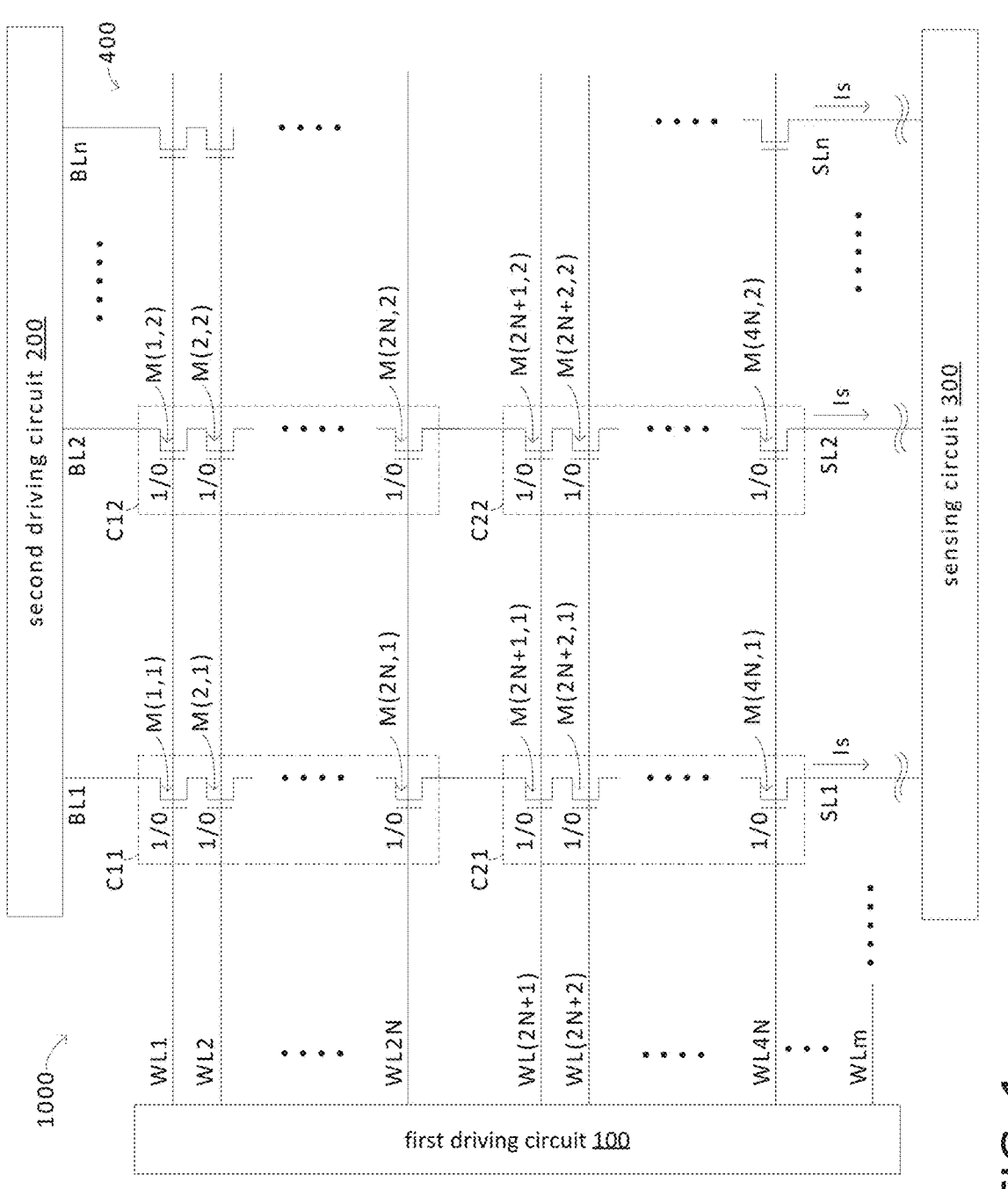
FIG. 1 is a circuit diagram of a NAND-type memory device utilizing word line search (WL-wise search) according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a circuit diagram of a NAND-type memory device 1000 utilizing word line search (WL-wise search) according to an embodiment of the disclosure. Referring to FIG. 1, the memory device 1000 is a NAND type memory, and the memory device 1000 includes a first driving circuit 100, a second driving circuit 200, a sensing circuit 300, an in-memory searching (IMS) array 400, a plurality of word lines WL1~WLm, a plurality of bit lines BL1~BLn and a plurality of source lines SL1~SLn.

The memory type of the IMS array 400 may be, for example, floating gate memory, floating dot memory, phase-change memory (PCM), ferroelectric random access memory. (FeRAM) or variable resistive random access memory (ReRAM), etc. The IMS array 400 includes a plurality of memory units M(i,j) arranged as the NAND type, and the memory units M(i,j) are arranged in m horizontal rows and n vertical columns. The control terminal (e.g., the gate terminal) of the memory unit M(i,j) in the i-th row is coupled to the first driving circuit 100 through the word line WLi. The memory units M(i,j) in the j-th column are connected in series, coupled to the second driving circuit 200 through the bit line BLj, and coupled to the sensing circuit 300 through the source line SLj.

The IMS array 400 has a parameter N, and N is a positive integer which is greater than or equal to two. The 2N adjacent memory units in the same column in the IMS array 400 are arranged as one memory cell. For example, memory units M(1,1)~M(2N,1) of the 1st row to the 2N-th row in the 1st column are arranged as memory cell C11, memory units M((2N+1),1)~M(4N,1) of the (2N+1)-th row to the 4N-th row in the 1st column are arranged as memory cell C21, and memory units M(1,2)~M(2N,2) of the 1st row to the 2N-th row in the 1st column are arranged as memory cell C12, and the like. The 2N memory units of each memory cell Cij stores an encoded data of 2N bits. The encoded data of the 1st bit to the N-th bit may form a first encoded area, the encoded data of the (N+1)-th bit to 2N-th bit may form a second encoded area, and encoding combinations number of the first encoded area and the second encoded area is equal to $$\frac{(2N)!}{N! \times N!}.$$

Correspondingly, 2N "search biases" may be inputted through the word lines WL1~WL2N to represent the "search data", and the combinations number of the search data is also equal to $$\frac{(2N)!}{N! \times N!}.$$

The above-mentioned 2N-bits encoded data is obtained by executing an encoding mechanism on an original data of M-bits, where M is a positive integer. The encoding combinations number $$\frac{(2N)!}{N! \times N!}$$

of the encoded data of 2N-bits is greater than or equal to "two to M-th power". For example, when N=3 and M=4, the encoding combinations number $$\frac{(2N)!}{N! \times N!}$$

is equal to $$\frac{6!}{3! \times 3!} = 20,$$

which is greater than or equal to "two to fourth power".

The first driving circuit 100 is configured to apply a programming voltage to the memory unit M(i,j) through the word lines WL1~WLm to change the threshold voltage (i.e., "Vt") of the memory unit M(i,j), so that the memory unit M(i,j) stores logical value "1" or logical value "0". Search biases may be applied through the word lines WL1~WLm to search for encoded data stored in the memory units Cij. When the search biases match the encoded data stored in the memory cell Cij, the corresponding source line SLj may output a source current Is to the sensing circuit 300, which indicates a success of search.

Figure 2A:
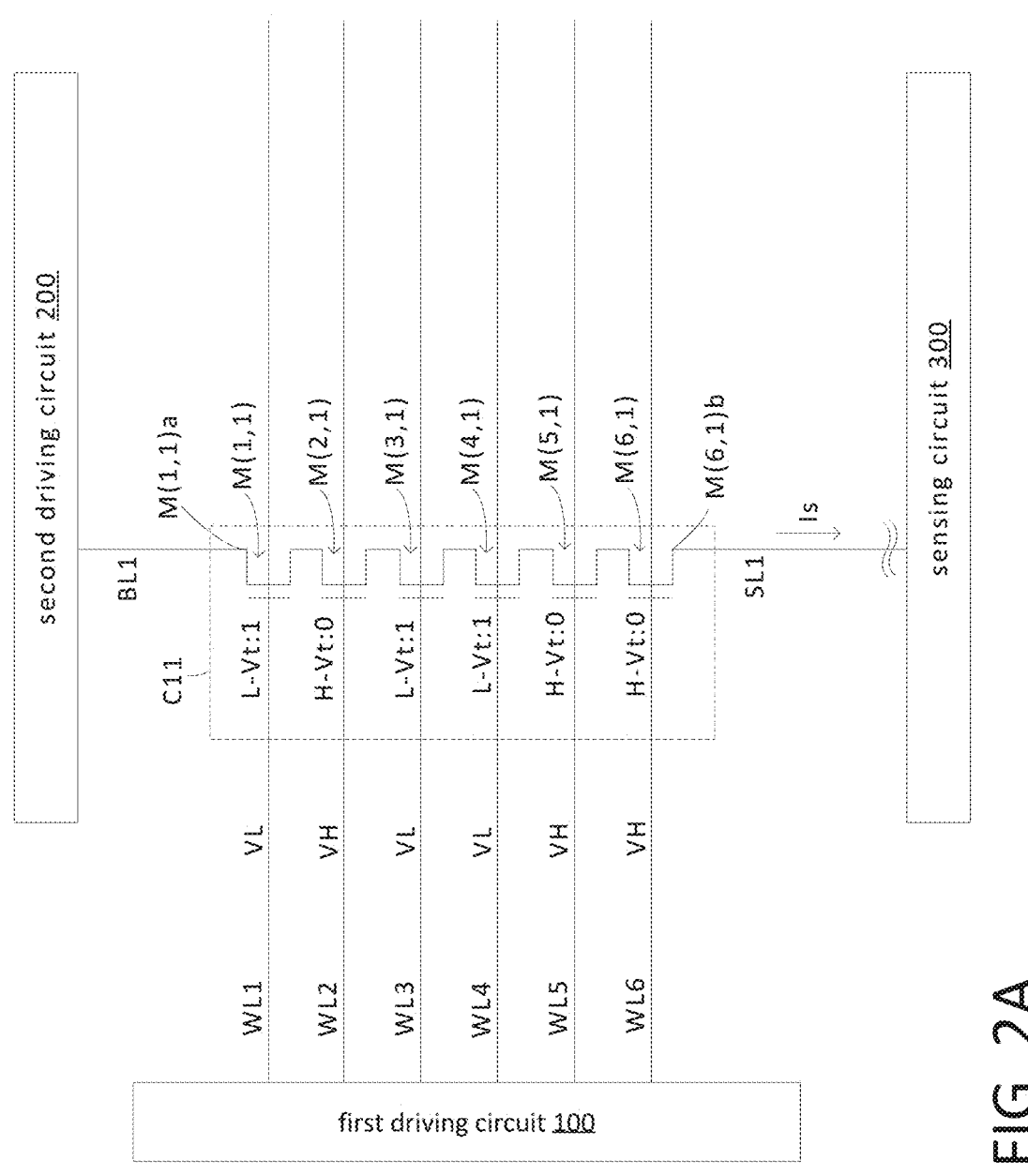
FIGS. 2A to 2C are schematic diagrams illustrating one of the memory cells in the memory device of FIG. 1 performs data search through word lines.
Figure 2B:
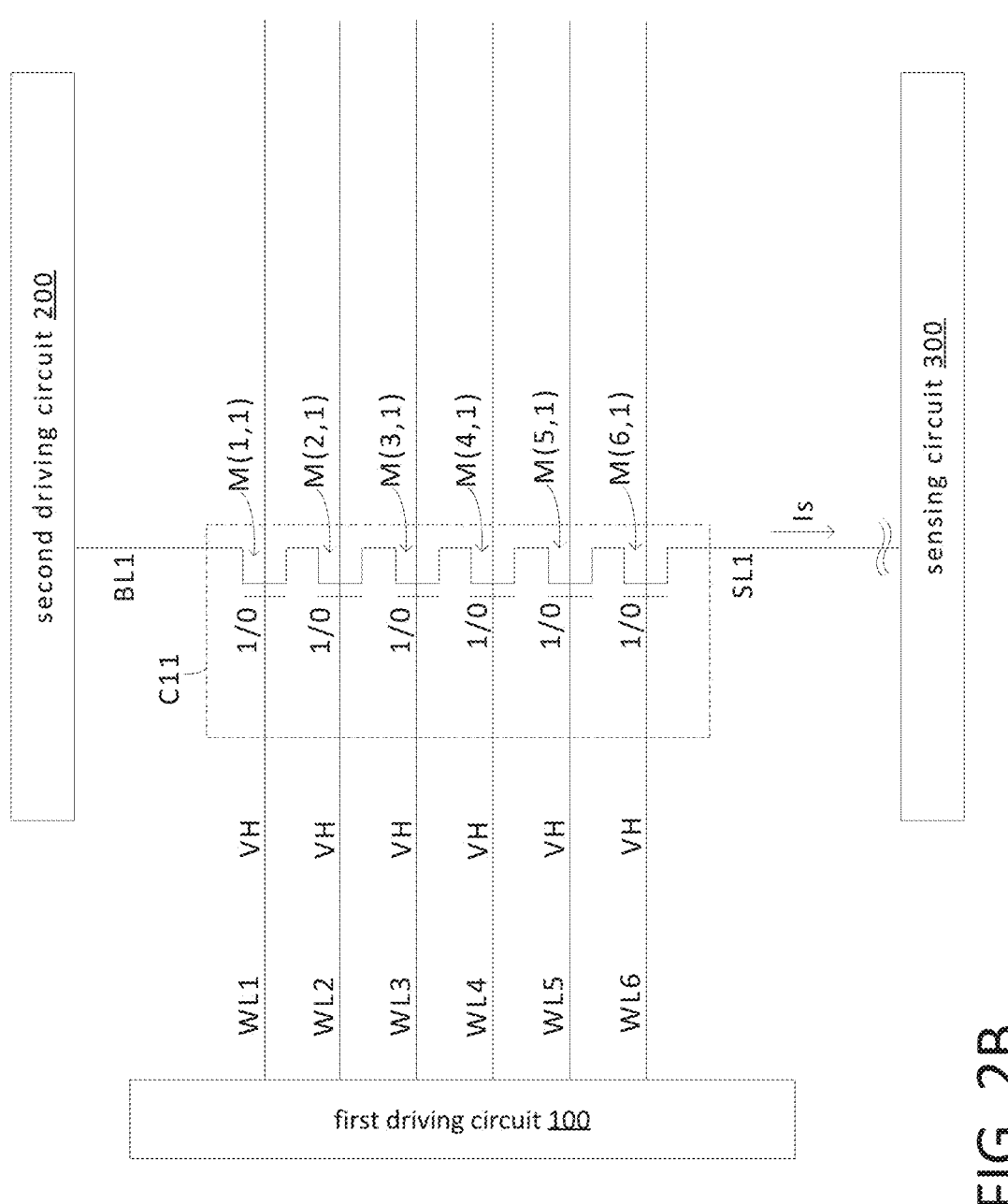
Figure 2C:
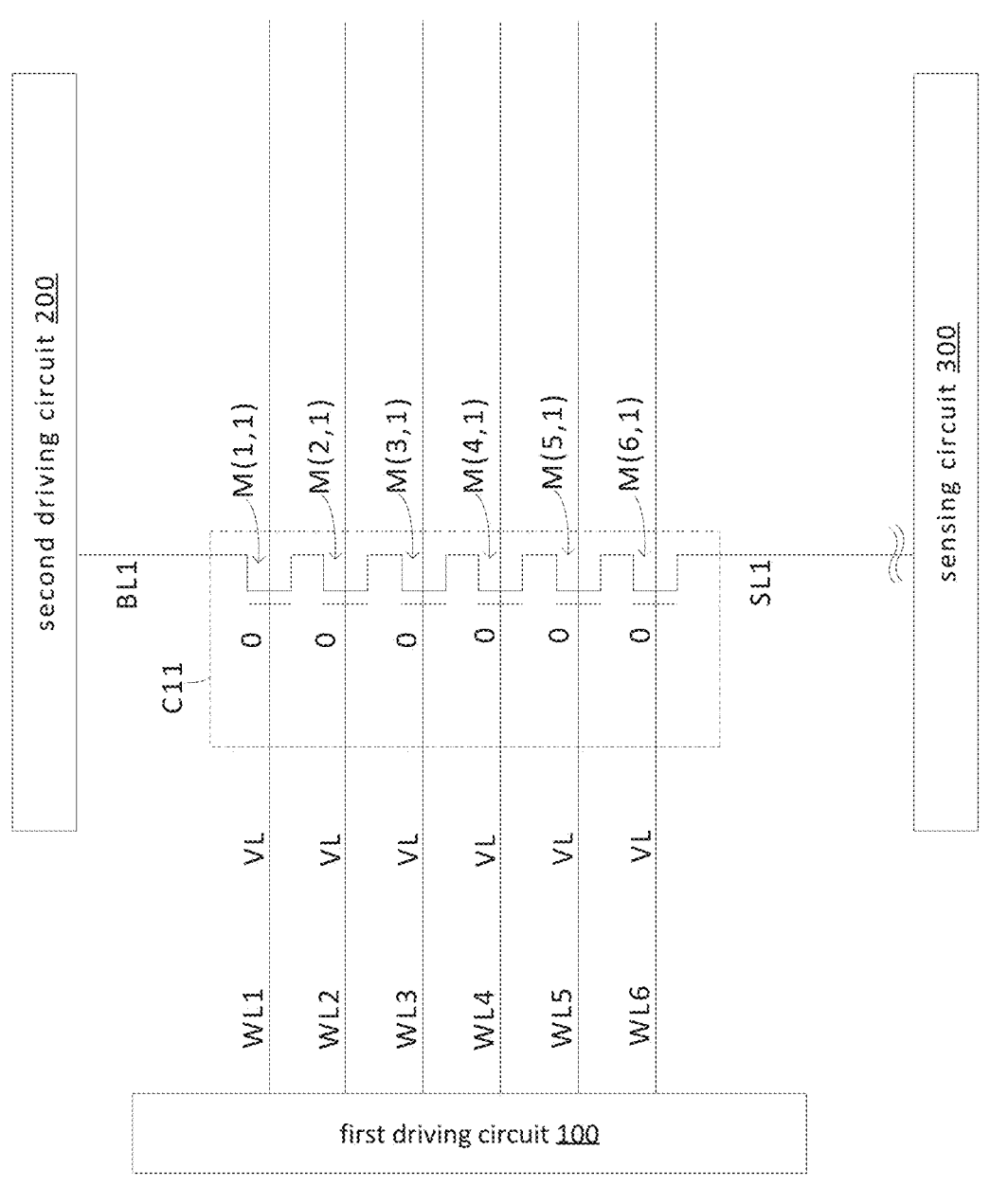

FIGS. 2A to 2C are schematic diagrams illustrating the memory cell C11 in the memory device 1000 of FIG. 1 performs data search through word lines WL1~WL6. Firstly, please refer to FIG. 2A, taking the parameter N=3 as an example, the memory cell C11 is a 6-layer memory cell including six memory units M(1,1)~M(6,1). The control terminals (e.g., gate terminals) of the memory units M(1,1)~M(6,1) are directly or indirectly coupled to the first driving circuit 100 through the word lines WL1~WL6. The first terminal (e.g., the drain terminal) M(1,1)a of the memory unit M(1,1) is directly or indirectly coupled to the second driving circuit 200 through the bit line BL1. The second terminal (e.g., the source terminal) M(6,1)b of the memory unit M(6,1) is directly or indirectly coupled to the sensing circuit 300 through the source line SL1.

The memory cell C11 may store an original data of 4-bits, and the original data is encoded as an encoded data of 6-bits through the encoding mechanism, and the encoded data is stored in the memory units M(1,1)~M(6,1). The encoding combinations number of the encoded data stored in the memory cell C11 and the combinations number of the search data inputted through the word lines WL1~WL6 are both equal to $$\frac{(6)!}{3! \times 3!} = 20.$$

Table 1 shows the relationship between the original data stored in the memory cell C11, the encoded data and the search data inputted through the word lines WL1~WL6:

TABLE 1

| original data | | | search data of word |
|---|---|---|---|
| decimal | binary | encoded data | line |
| 0 | 0000 | 000111 | HHHLLL |
| 1 | 0001 | 001011 | HHLHLL |
| 2 | 0010 | 001101 | HHLLHL |
| 3 | 0011 | 001110 | HHLLLH |
| 4 | 0100 | 010011 | HLHHLL |
| 5 | 0101 | 010101 | HLHLHL |
| 6 | 0110 | 010110 | HLHLLH |
| 7 | 0111 | 011001 | HLLHHL |
| 8 | 1000 | 011010 | HLLHLH |
| 9 | 1001 | 011100 | HLLLHH |
| 10 | 1010 | 100011 | LHHHLL |
| 11 | 1011 | 100101 | LHHLHL |
| 12 | 1100 | 100110 | LHHLLH |
| 13 | 1101 | 101001 | LHLHHL |
| 14 | 1110 | 101010 | LHLHLH |
| 15 | 1111 | 101100 | LHLLHH |
| 16 | — | 110001 | LLHHHL |
| 17 | — | 110010 | LLHHLH |
| 18 | — | 110100 | LLHLHH |
| 19 | — | 111000 | LLLHHH |
| 0~19 | | 111111 | HHHHHH |
| | | (don't care | (wildcard) |
| Invalid data | | 000000 | LLLLLL |
| | | | (invalid search) |

Please refer to Table 1, in the encoding mechanism of this embodiment, the 4-bit original data with binary values "0000" to "1111" (corresponding to decimal values "0" to "15") is encoded as 6-bit encoded data "000111" to "101100". Furthermore, the encoded data "111111" represents "don't care" which corresponds to any one of binary values "0" to "19" of the original data. Furthermore, the encoded data "000000" represents "invalid data".

Referring to FIG. 2A, the first driving circuit 100 may be configured to program the memory units M(1,1)~M(6,1) in the memory cell C11 to have a "first threshold voltage H-Vt" or a "second threshold voltage L-Vt" through the word lines WL1~WL6. The first threshold voltage H-Vt has a higher voltage level and corresponds to the storage data of logic value "0". The second threshold voltage L-Vt has a lower voltage level and corresponds to the storage data of logic value "1". The first threshold voltage H-Vt is greater than the second threshold voltage L-Vt. Threshold voltages of the memory units M(1,1)~M(6,1) may be programmed as "L-Vt, H-Vt, L-Vt, L-Vt, H-Vt, H-Vt", so that memory units M(1,1)~M(6,1) may store 6-bit encoded data "101100" which corresponds to 4-bit original data "1111" (i.e., decimal value of "15").

Figure 3:
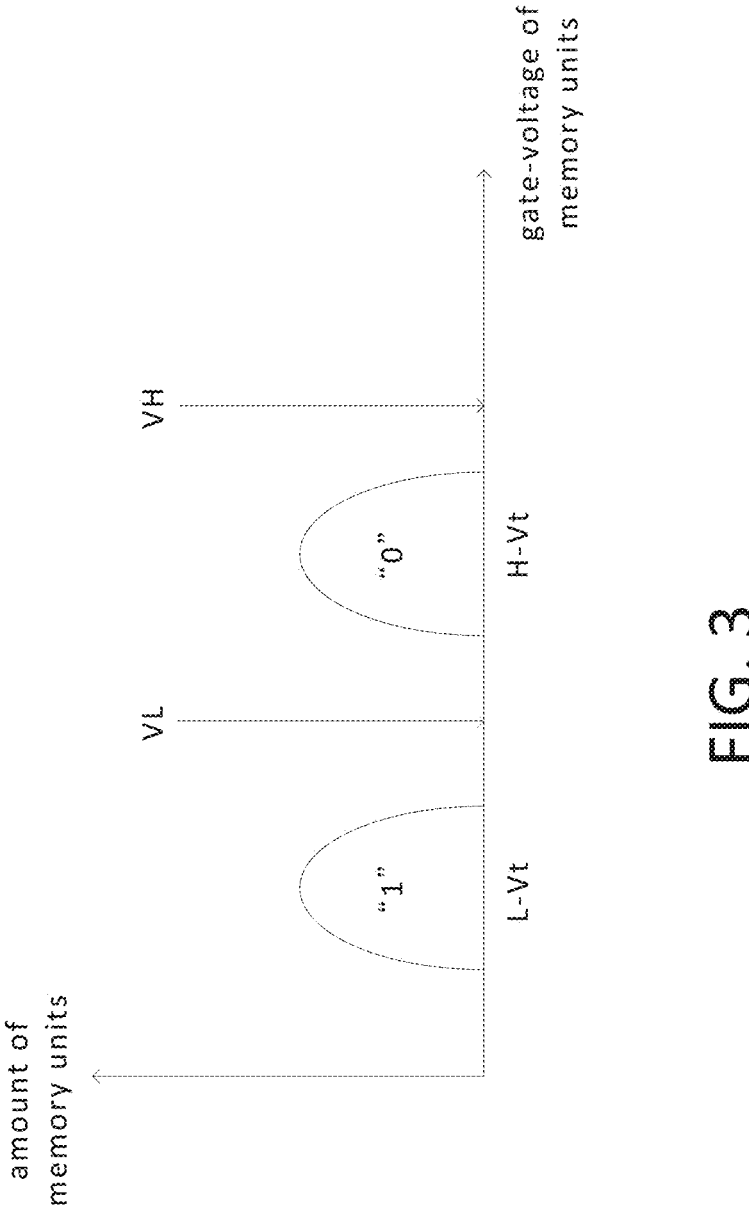
FIG. 3 is a diagram illustrating the relationship between the search bias inputted through the word line and the threshold voltage of the memory unit in the memory device of FIG. 1.

Furthermore, the first driving circuit 100 may be configured to input search bias through the word lines WL1~WL6 to search for encoded data stored in the memory units M(1,1)~M(6,1). Please also refer to FIG. 3, which is a diagram illustrating the relationship between search biases inputted through the word line WLi and threshold voltages of the memory unit M(i,j) in the memory device 1000 of FIG. 1. In this embodiment, the inputted search bias has a "first voltage level VH" or a "second voltage level VL". The first voltage level VH of the search bias has a higher voltage level, which represents a search data "H" and corresponds to the bit of logic value "0" stored in the memory unit M(i,j). On the other hand, the second voltage level VL of the search bias has a lower voltage level, which represents a search data "L" and corresponds to the bit of logic value "1" stored in the memory unit M(i,j). The first voltage level VH of the search bias is greater than the second voltage level VL, and the first voltage level VH of the search bias is greater than the first threshold voltage H-Vt of the memory unit M(i,j). Furthermore, the second voltage level VL of the search bias is less than the first threshold voltage H-Vt of the memory unit M(i,j) and greater than the second threshold voltage L-Vt. Search biases with the first voltage level VH or the second voltage level VL are inputted to the gates of the memory units M(i,j) through the word line WLi. If the search bias with the first voltage level VH is inputted, regardless of logic value "1" or logic value "0" stored in the memory unit M(i,j), the search bias with the first voltage level VH may turn on the memory unit M(i,j) to generate a source current Is. If the search bias with the second voltage level VL is inputted, the search bias with the second voltage level VL may turn on the memory unit M(i,j) to generate source current Is only when the memory unit M(i,j) stores logic value "1".

Referring to FIG. 2A again, search biases with voltage levels of "VL, VH, VL, VL, VH, VH" are inputted through the word lines WL1-WL6 to represent search data "LHLLHH". The memory units M(1,1)~M(6,1) of the memory cell C11 store encoded data "101100", and threshold voltages of the memory units M(1,1)~M(6,1) are "L-Vt, H-Vt, L-Vt, L-Vt, H-Vt, H-Vt". Therefore, search biases with voltage levels of "VL, VH, VL, VL, VH, VH" may turn on all the memory units M(1,1)~M(6,1), so that each of memory units M(1,1)~M(6,1) may generate a source current Is. Accordingly, the sensing circuit 300 may sense the source current Is outputted by source line SL1, and source current Is may serve as a "match current". When the sensing circuit 300 senses the matching current, it can be determined that search data "LHLLHH" inputted by the word lines WL1~WL6 match the encoded data "101100" stored in the memory cell C11, indicating a success of search.

Next, referring to FIG. 2B and Table 1, when the search bias with the first voltage level VH is inputted through each of the word lines WL1~WL6, search data "HHHHHH" inputted through the word lines WL1~WL6 may serve as a "wildcard". Meanwhile, regardless of logic value "0" or logic value "1" stored in the memory units M(1,1)~M(6,1) having first threshold voltage H-Vt or second threshold voltage L-Vt, search bias with the first voltage level VH may turn on memory units M(1,1)~M(6,1) to generate source current Is. Therefore, the sensing circuit 300 may sense the match current to determine the search is successful. In other words, search data "HHHHHH" as a wildcard can unconditionally match encoded data of various combinations of logical values "0" or "1".

On the other hand, referring to FIG. 2C and Table 1, when the search bias with the second voltage level VL is inputted to each of the word lines WL1~WL6, search data "LLLLLL" inputted through the word lines WL1~WL6 may serve as "invalid search". Meanwhile, if the memory units M(1,1)~M(6,1) store logic value "0" having the first threshold voltage H-Vt, search bias with the second voltage level VL cannot turn on the memory units M(1,1)~M(6,1), so that source current Is not generated. The sensing circuit 300 cannot sense the match current and hence determines the search fails.

Figure 4:
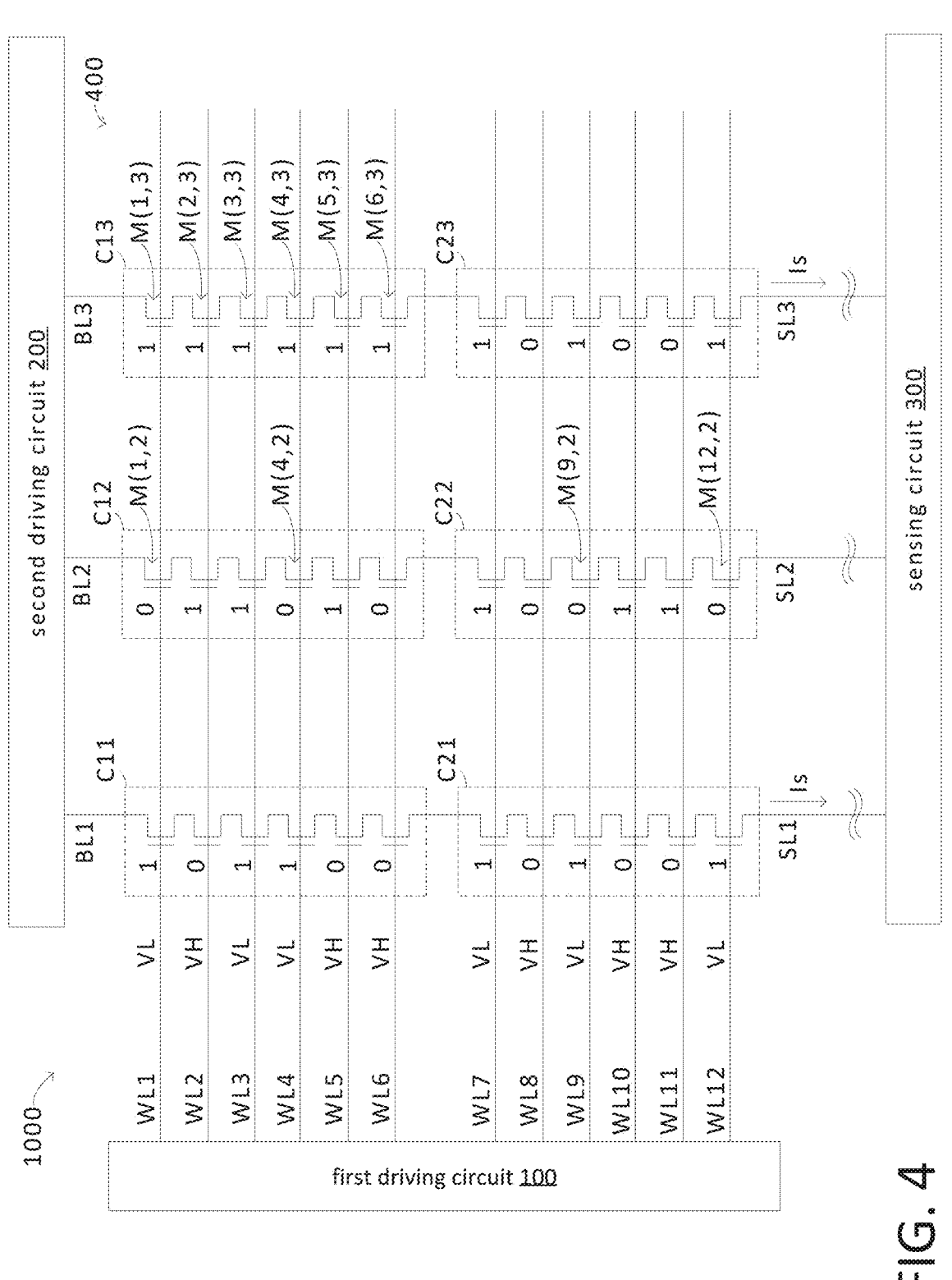
FIG. 4 is a diagram illustrating the memory device of FIG. 1 performs data search via word lines.

FIG. 4 is a diagram illustrating the memory device 1000 of FIG. 1 performs data search via word lines WL1~WL12. The IMS array 400 of the memory device 1000 includes, for example, memory cells C11, C12, C13, C21, C22, and C23. The memory cells C11 and C21 are coupled to the bit line BL1, the memory cell C11 stores the encoded data "101100", and the memory cell C21 stores the encoded data "101001". When search biases with voltage levels of "VL, VH, VL, VL, VH, VH" are inputted through word lines WL1-WL6 to indicate search data "LHLLHH", memory cell C11 storing encoded data "101100" can be turned on to generate source current Is. Furthermore, when search biases with voltage levels of "VL, VH, VL, VH, VH, VL" are inputted through word lines WL7-WL12 to indicate search data "LHLHHL", memory cell C21 storing encoded data "101001" can be turned on to generate source current Is. Accordingly, the sensing circuit 300 can receive source current Is (i.e., the match current) from the source line SL, and can determine that encoded data "101100" stored in the memory cell C11 matches search data "LHLLHH", and encoded data "101001" stored in the memory cell C21 matches search data "LHLHHL", indicating the search is successful.

On the other hand, the memory cell C12 and the memory cell C22 are coupled to the bit line BL2, the memory cell C12 stores encoded data "011010", and the memory cell C22 stores encoded data "100110". When the word lines WL1~WL6 input search biases with voltage levels of "VL, VH, VL, VL, VH, VH", memory units M(1,2) and M(4,2) of the memory cell C12 cannot be turned on, hence memory cell C12 cannot provide source current Is. When the word lines WL7-WL12 input search biases with voltage levels of "VL, VH, VL, VH, VH, VL", memory units M(9,2) and M(12,2) of memory cell C22 cannot be turned on, hence the memory cell C22 also cannot provide source current Is. The sensing circuit 300 cannot sense source current Is of the source line SL2, hence determines that encoded data stored in the memory cells C12 and C22 do not match the search data, which indicates a failure of the search.

Furthermore, the memory cells C13 and C23 are coupled to the bit line BL3. The encoded data "111111" stored in the memory cell C13 represents "don't care" and corresponds to any one of binary values "0" to "19" of original data. No matter the word lines WL1-WL6 input search bias with first voltage level VH or search bias with second voltage level VL, each of the memory units M(1,3)~M(6,3) can be turned on to generate source current Is, hence encoded data "111111" stored in the memory cell C13 can matches either search bias with first voltage level VH or search bias with second voltage level VL. In addition, encoded data "101001" stored in the memory cell C23 is the same as the memory cell C21 and matches search data "LHLHHL" inputted by the word lines WL7-WL12.

Figure 5:
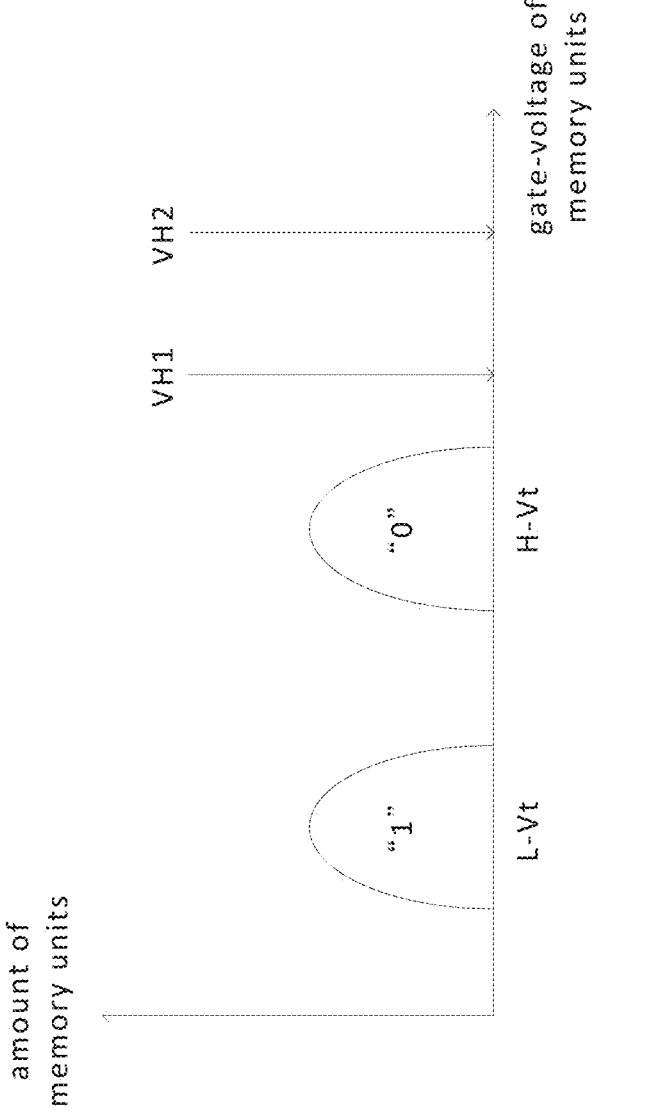
FIG. 5 is a diagram illustrating the relationship between the search bias inputted through the word line and the threshold voltage of the memory unit in another embodiment of the memory device of FIG. 1.

FIG. 5 is a diagram illustrating the relationship between the search biases inputted through the word line and the threshold voltages of the memory unit in another embodiment of the memory device 1000 of FIG. 1. In the embodiment of FIG. 5, search bias may have a "third voltage level VH2" or a "fourth voltage level VH1". The "third voltage level VH2" of the search bias represents a search data "H" and corresponds to the bit of logic value "0" stored in the memory unit M(i,j). The "fourth voltage level VH1" of the search bias represents a search data "L" and corresponds to the bit of logic value "1" stored in the memory unit M(i,j). The third voltage level VH2 of the search bias is greater than the fourth voltage level VH1, and the fourth voltage level VH1 is greater than the first threshold voltage H-Vt and the second threshold voltage L-Vt.

When search bias with the third voltage level VH2 matches the bit of logic value "0" stored in the memory unit M(i,j), and logic value "0" corresponds to the first threshold voltage H-Vt, then voltage difference between search bias with third voltage level VH2 and first threshold voltage H-Vt is greater. Therefore, memory unit M(i,j) can generate a large source current Is (i.e., match current). When search bias with fourth voltage level VH1 matches the bit of logic value "1" stored in the memory unit M(i,j), and logic value "1" corresponds to second threshold voltage L-Vt, then voltage difference between search bias with fourth voltage level VH1 and second threshold voltage L-Vt is also greater. Hence, the memory unit M(i,j) can also generate a larger source current Is. On the other hand, when search bias with fourth voltage level VH1 does not match the bit of logic value "0" stored in the memory unit M(i,j), voltage difference between search bias with fourth voltage level VH1 and first threshold voltage H-Vt corresponding to logic value "0" is smaller. Hence, the source current Is of the memory unit M(i,j) is smaller. From the above, when a larger match current is sensed by the sensing current 300, it is determined that search data matches the bit of the stored data. On the contrary, if the match current is small, it is determined that search data does not match the bit of the stored data.

Figure 6:
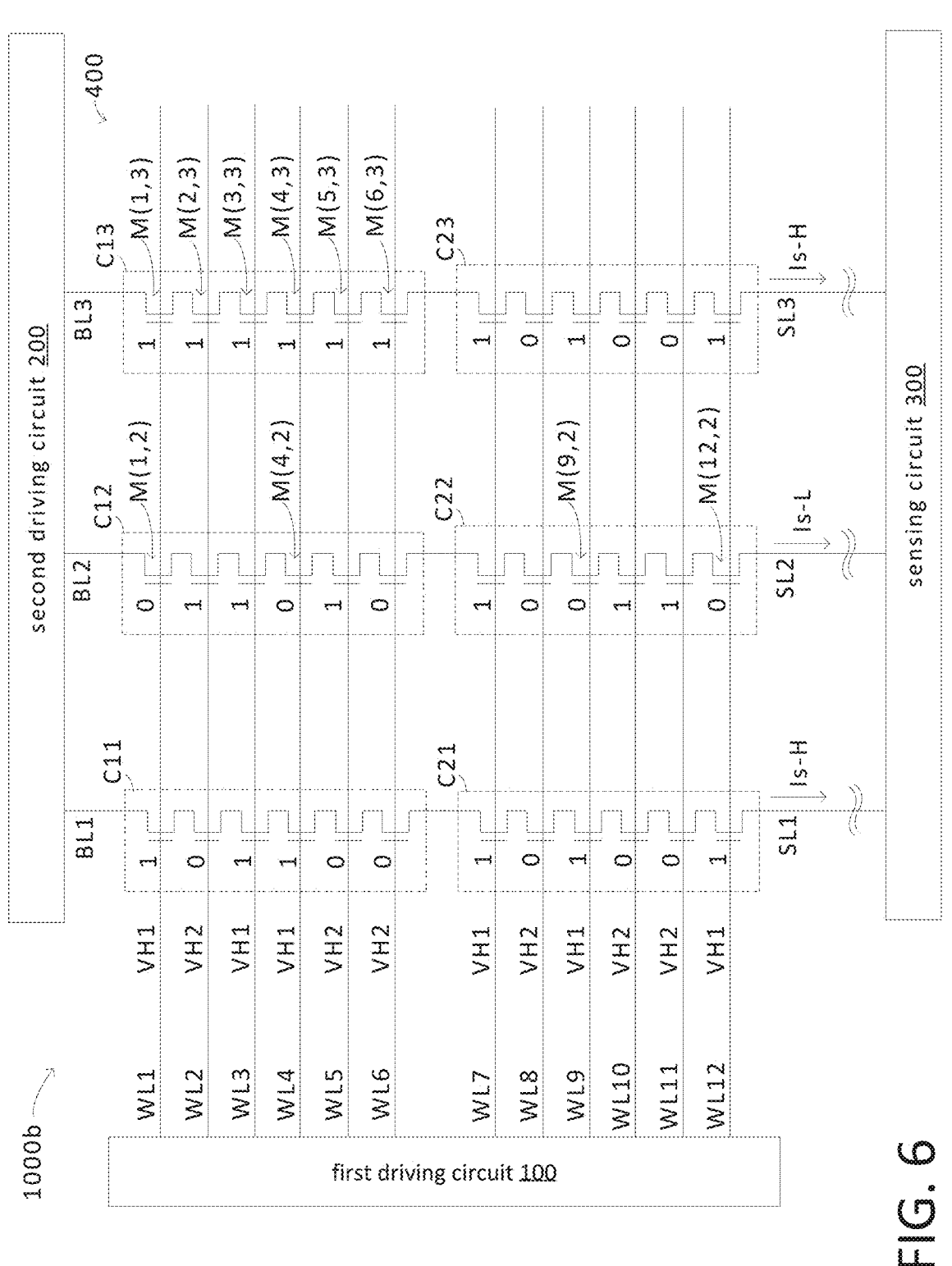
FIG. 6 is a diagram illustrating another embodiment of the memory device of FIG. 1 performs data search via word lines by the search bias of FIG. 5.

FIG. 6 is a diagram illustrating another embodiment of the memory device 1000 of FIG. 1 performs data search via word lines WL1~WL12 by the search biases (having the third voltage level VH1 or the fourth voltage level VH2) of FIG. 5. The encoded data stored in the memory cells C11~C23 in FIG. 6 are the same as the embodiment in FIG. 4. Word lines WL1~WL6 input search biases with voltage levels of "VH1, VH2, VH1, VH1, VH2, VH2" to represent search data "LHLLHH", and word lines WL7~WL12 input search biases with voltage levels of "VH1, VH2, VH1, VH2, VH2, VH1" to represent search data "LHLHHL". Meanwhile, the memory cells C11 and C21 match the search data and may generate a first source current Is-H with a larger current value.

On the other hand, the bits of logic value "0" stored in the memory units M(1,2) and M(4,2) of the memory cell C12 do not match search bias with fourth voltage level VH1, and the bits of logic value "0" stored in the memory units M(9,2) and M(12,2) of the memory cell C22 do not match search bias VH1. Hence, the source line SL2 provides a second source current Is-L, where current value of the second source current Is-L is smaller than the first source current Is-H.

Furthermore, each of the memory units M(1,3)~M(6,3) of the memory cell C13 stores logic value "1" and corresponds to "111111" (i.e., don't care), hence the memory cell C13 matches the search data and may generate a first source current Is-H with a larger current value.

Figure 7C:
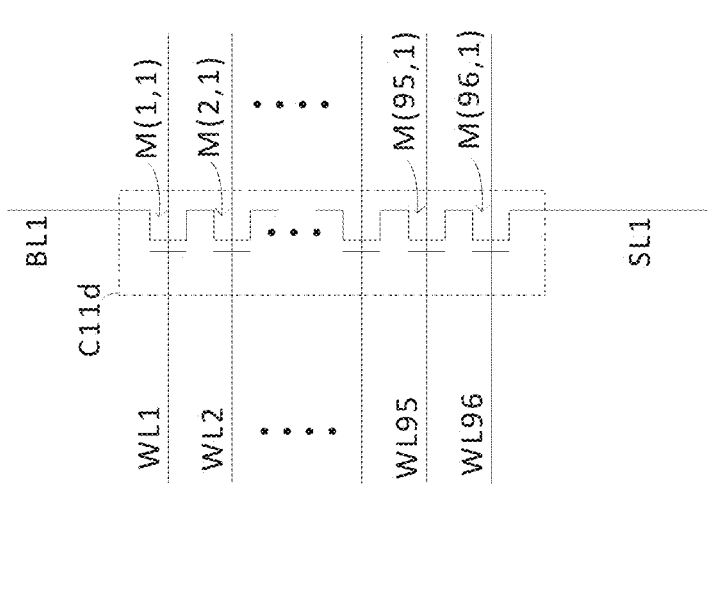
FIGS. 7A to 7C are respective diagrams of different layers of memory cells in a NAND-type memory device.
Figure 7B:
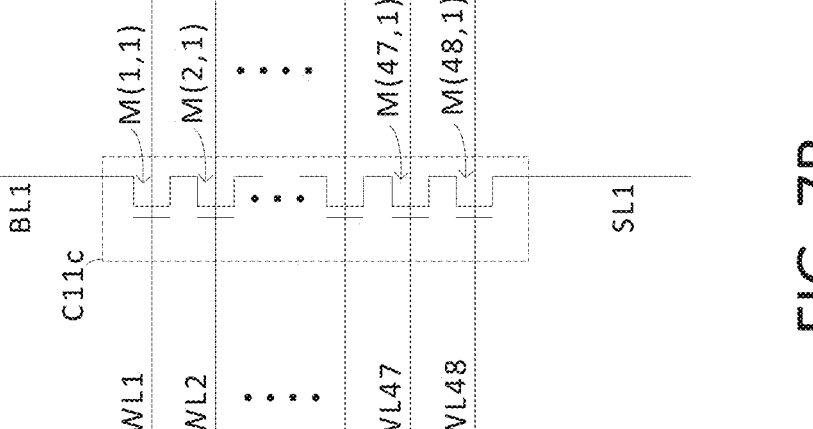
Figure 7A:
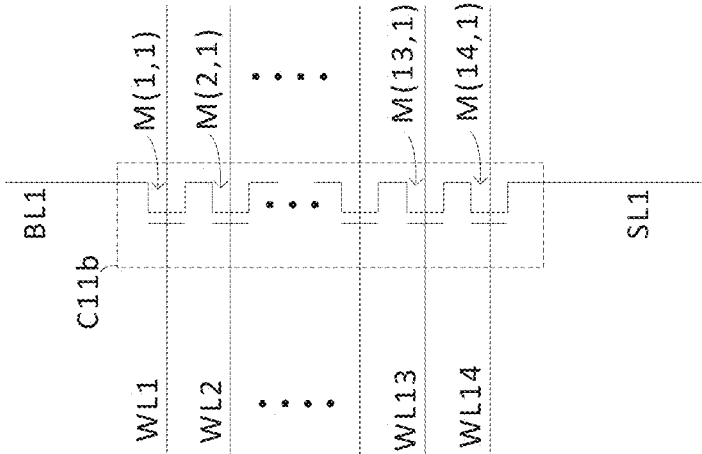

FIGS. 7A to 7C are diagrams illustrating different layers of memory cells C11b, C11c, and C11 in a NAND-type memory device. The memory cell C11b of FIG. 7A is a 14-layer memory cell, which consists of fourteen adjacent memory units M(1,1)~M(14,1) arranged in the same column. Data search are performed through fourteen word lines WL1~WL14. The 14-layer memory cell C11b has a parameter N=7, the encoded data and search data both have combinations number of $$\frac{(14)!}{7! \times 7!} = 924.$$

Since the binary value of 9 bits has combinations number of 512, and the binary value of 10 bits has combinations number of 1024, the 14-layer memory cell C11b with combinations number of 924 may equivalently store about 9.5 bits.

The memory cell C11c of FIG. 7B is a 48-layer memory cell, which consists of forty-eight memory units M(1,1)~M(48,1). Data search may be performed through forty-eight word lines WL1~WL48. The 48-layer memory cell C11c has a parameter N=24, the encoded data and search data both have combinations number of $$\frac{(48)!}{24! \times 24!},$$

which is equivalent to 45 bits.

The memory cell C11d of FIG. 7C is a 96-layer memory cell, which consists of ninety-six memory units M(1,1)~M(96,1). Data search may be performed through ninety-six word lines WL1-WL96. The 96-layer memory cell C11d has a parameter N=48, the encoded data and search data both have combinations number of $$\frac{(96)!}{48! \times 48!},$$

which is equivalent to 92 bits.

Figure 8:
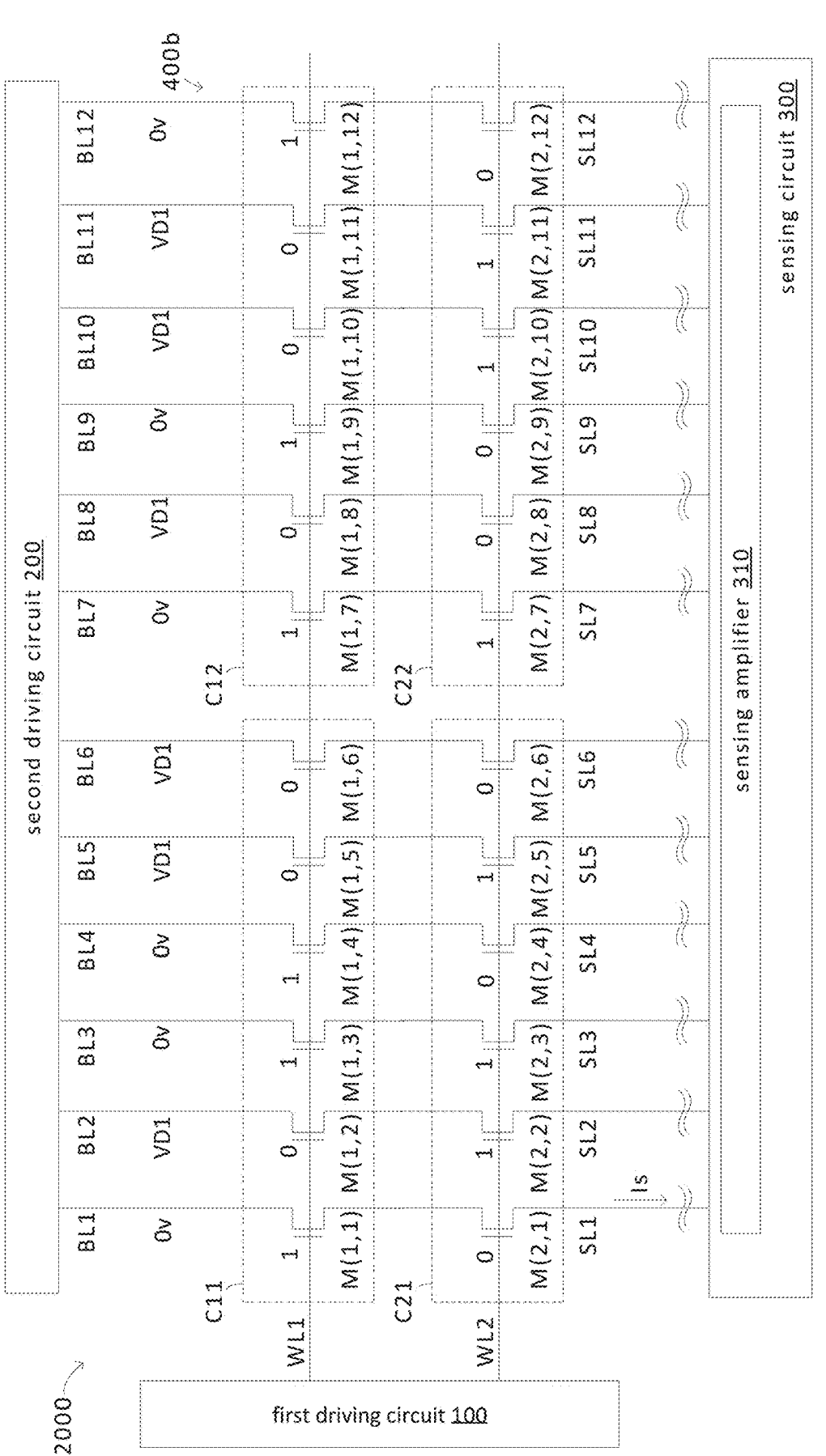
FIG. 8 is a circuit diagram of a NAND-type memory device utilizing bit line search (BL-wise search) according to an embodiment of the disclosure.

FIG. 8 is a circuit diagram of a NAND-type memory device 2000 utilizing bit line search (BL-wise search) according to an embodiment of the disclosure. The memory device 2000 is also a NAND-type memory, and search data can be inputted through the bit lines BL1-BL12. The 2N adjacent memory units of the same horizontal row in the IMS array 400b of the memory device 2000 are arranged as one memory cell. Taking the 6-layer memory cell with parameter N=3 as an example, the memory units M(1,1)~M(1,6) in the 1st column to 6-th column of the 1st row are arranged as memory cell C11, furthermore, the memory units M(1,7)~M(1,12) in the 7-th column to 12-th column of the 1st row are arranged as memory cell C12, and so on.

In this embodiment, the memory device 2000 inputs search biases through the bit lines. Search bias may have a "first drain voltage level VD1" or a "second drain voltage level VD2". Search bias with first drain voltage level VD1 represents a search data "H" and corresponds to the bit of logic value "C" stored in the memory unit M(i,j). Search bias with second drain voltage level VD2 represents a search data "L" and corresponds to the bit of logic value "1" stored in the memory unit M(i,j). The first drain voltage level VD1 of search bias is greater than the second drain voltage level VD2, and the second drain voltage level VD2 is substantially zero volts (the second drain voltage level VD2 may be represented as "0v"). Taking memory cell C11 as an example, search biases with voltage levels of "VD2, VD1, VD2, VD2, VD1, VD1" (i.e., "0v, VD1, 0v, 0v, VD1, VD1") are inputted through the bit lines BL1-BL6, which corresponds to search data "LHLLHH", and a select voltage Vsel is inputted through the word line WL1 and applied to gates of memory units M(1,1)~M(1,6). Memory units M(1,2), M(1,5), M(1,6) are programmed to have first threshold voltage H-Vt, hence memory units M(1,2), M(1,5), M (1,6) cannot be turned on by the select voltage Vsel and cannot provide source current Is. On the other hand, the memory units M(1,1), M(1,3) and M(1,4) are programmed to have second threshold voltage L-Vt and thus can be turned on by the select voltage Vsel. However, the drains of the memory units M(1,1), M(1,3) and M(1,4) receive search bias with second drain voltage level VD2 through the bit lines BL1, BL3 and BL4 where second drain voltage level VD2 is substantially 0v, hence the memory units M(1,1), M(1,3) and M(1,4) cannot provide source current Is. From the above, when the search data "LHLLHH" inputted through the bit lines BL1~BL6 match the encoded data "101100" stored in the memory cell C11, the memory units M(1, 1)~M(1,6) of the memory cell C11 cannot generate source current Is, and the sensing amplifier (SA) 310 of the sensing circuit 300 cannot sense the source current Is.

Next, the word line WL2 inputs the select voltage Vsel to the gates of the memory units M(2,1)-M(2,6) of the memory cell C21. The memory units M(2,1), M(2,4), and M(2,6) are programmed to have first threshold voltage H-Vt and thus cannot be turned on by the select voltage Vsel and cannot provide source current Is. On the other hand, the memory units M(2,2), M(2,3) and M(2,5) are programmed to have second threshold voltage L-Vt and can be turned on by the select voltage Vsel, where drains of the memory units M(2,2) and M(2,5) receive search bias with first drain voltage level VD1 from the bit lines BL2 and BL5, hence the memory units M(2,2) and M(2,5) can generate source current Is. From the above, when search data "LHLLHH" inputted from the bit lines BL1~BL6 do not match the encoded data "011010" stored in the memory cell C21, the sense amplifier 310 can sense source current Is from some memory units (i.e., memory units M(2,2) and M(2,5)) of the memory cell C21.

In the embodiment of FIG. 8, the sense amplifier 310 senses the source current Is through the source lines SL1~SL12 to determine whether search data matches the stored encoded data. In other embodiments, the output of the sensing amplifier 310 can also be counted, accumulated and weighted, and a "degree of matching" between search data and stored encoded data can be analyzed.

Figure 9:
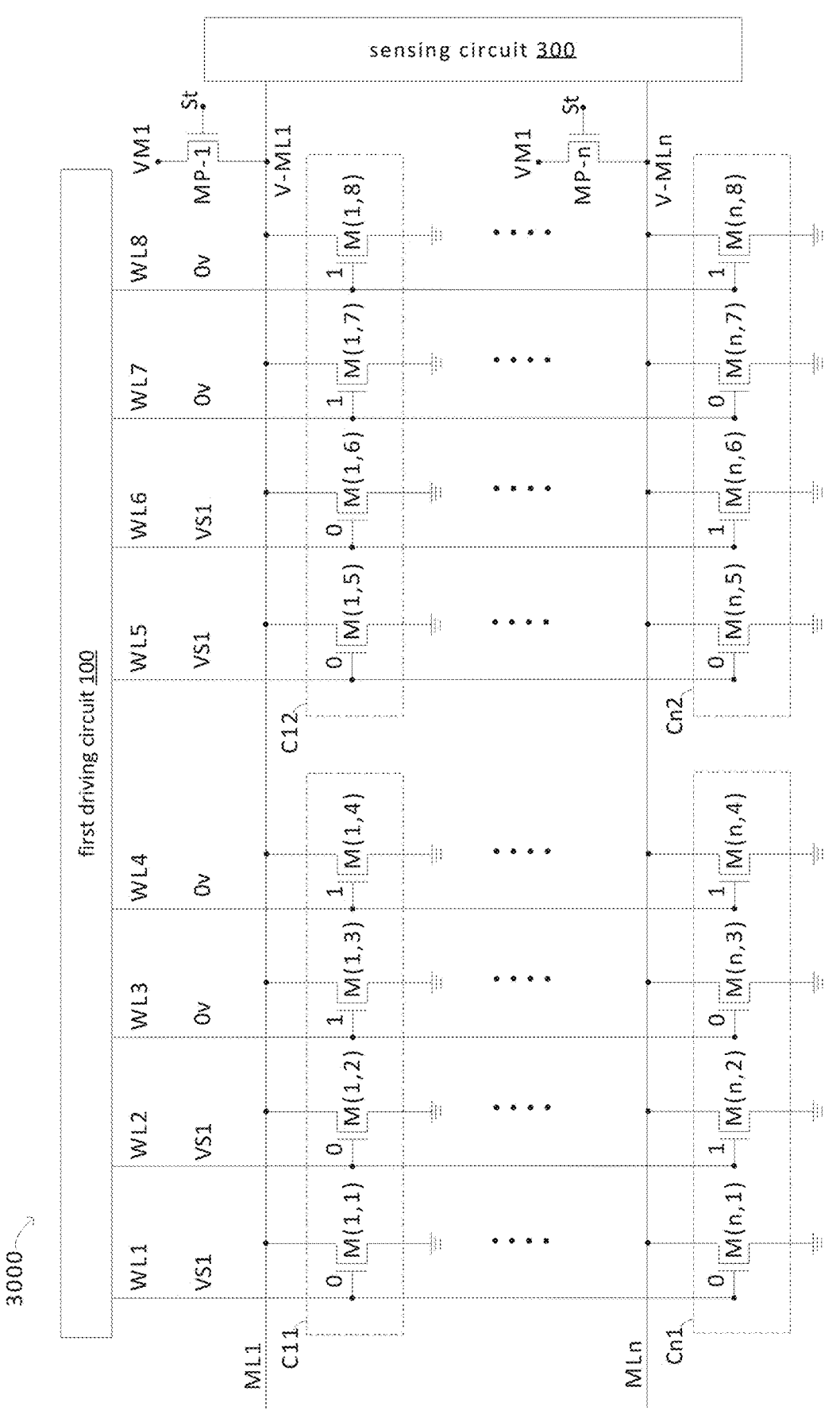
FIG. 9 is a circuit diagram of a NOR-type memory device according to an embodiment of the disclosure.

FIG. 9 is a circuit diagram of a NOR-type memory device 3000 according to an embodiment of the disclosure. Taking the 4-layer memory cell with parameter N=2 as an example, the memory cell C11 includes four memory units M(1,1) ~M(1,4) arranged in a NOR-type. The control terminals (e.g., gate terminals) of the memory units M(1,1)~M(1,4) are respectively coupled to the word lines WL1~WL4, and the first terminals (e.g., the drain terminals) of memory units M(1,1)~M(1,4) are commonly coupled to a match signal line ML1. Moreover, the match signal line ML1 is coupled to the source of a pre-charge transistor MP-1 and the sensing circuit 300.

The drain of pre-charge transistor MP-1 is coupled to a DC voltage source or receives a DC voltage signal (not shown), the DC voltage source or DC voltage signal has a "first match voltage level VM1", hence the drain of pre-charge transistor MP-1 also has the first match voltage level VM1. Furthermore, the gate of pre-charge transistor MP-1 receives a control signal St. Before search bias is inputted to perform data search, the control signal St may turn-on the pre-charge transistor MP-1 to pull-up the source of the pre-charge transistor MP-1 to the first match voltage level VM1, so as to pull-up the match signal line ML1 to the first match voltage level VM1. After inputting search biases, according to match result for the search biases and stored data in memory units, the match signal line ML1 may be maintained at the first match voltage level VM1 or pulled-down to a "second match voltage level VM2". Wherein, the first match voltage level VM1 is greater than the second match voltage level VM2.

In this embodiment, search biases may be inputted through the word lines WL1-WL4. The search bias may have a "first gate voltage level VS1" or a "second gate voltage level VS2". The first gate voltage level VS1 of the search bias represents the search data "H" and corresponds to the bit of logic value "0" stored in the memory unit M(i,j). The second gate voltage level VS2 of the search bias represents the search data "L" and corresponds to the bit of logic value "1" stored in the memory unit M(i,j). The first gate voltage level VS1 of the search bias is greater than the second gate voltage level VS2, and the first gate voltage level VS1 is greater than the first threshold voltage H-Vt. Furthermore, the second gate voltage level VS2 is substantially zero volts (i.e., the second gate voltage level VS2 may be also represented as "0v"). Table 2 shows the relationship between the original data, the encoded data, the search bias inputted by the word line and the search data stored in the memory units of the memory device 3000:

TABLE 2

| Original data | | Encoded | Search bias of word | Search data |
| --- | --- | --- | --- | --- |
| decimal | binary | data | lines | of word lines |
| 0 | 00 | 0011 | VS1, VS1, 0v, 0v | HHLL |
| 1 | 01 | 0101 | VS1, 0v, VS1, 0v | HLHL |
| 2 | 10 | 0110 | VS1, 0v, 0v, VS1 | HLLH |
| 3 | 11 | 1001 | 0v, VS1, VS1, 0v | LHHL |
| 4 | — | 1010 | 0v, VS1, 0v, VS1 | LHLH |
| 5 | — | 1100 | 0v, 0v, VS1, VS1 | LLHH |
| 0~5 | | 0000 (don't care) | 0v, 0v, 0v, 0v (wildcard) | LLLL (wildcard) |
| Invalid data | | 1111 | VS1,VS1,VS1,VS1 (invalid search) | HHHH (invalid search) |

Figure 10:
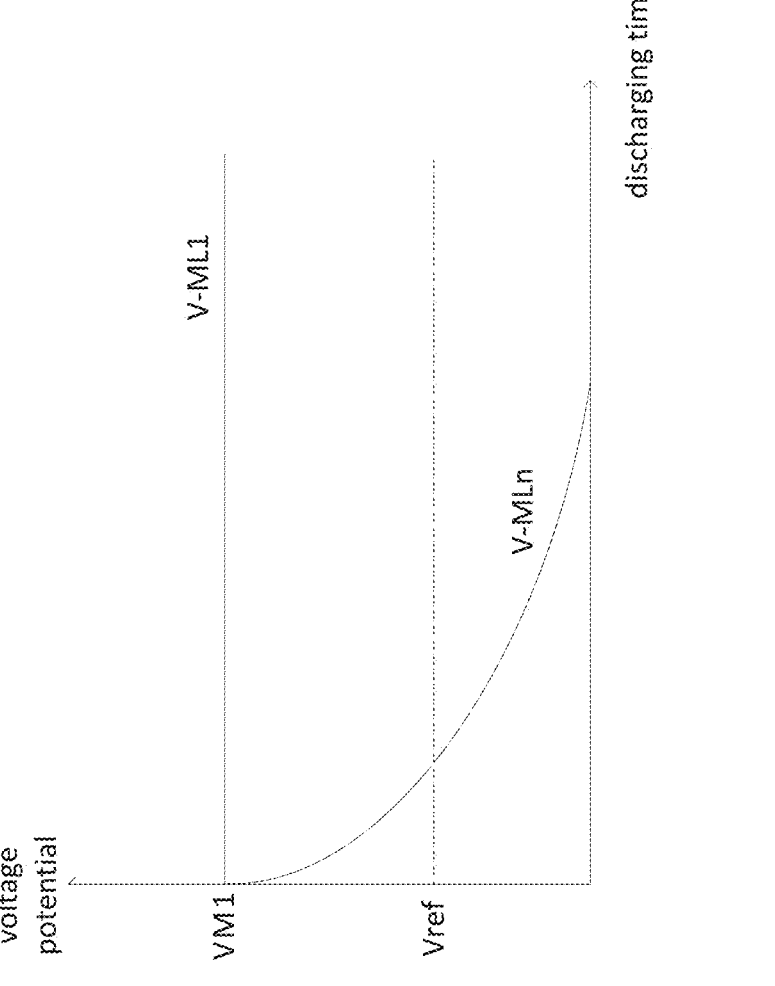
FIG. 10 is a timing diagram of the voltage level of the match signal lines in the memory device of FIG. 9.

FIG. 10 is a timing diagram of the voltage level V-ML1 and V-MLn of the match signal lines ML1 and MLn in the memory device 3000 of FIG. 9. Referring to FIGS. 9 and 10 and Table 2, search biases with voltage levels of "VS1, VS1, VS2, VS2" (i.e., "VS1, VS1, 0v, 0v") are inputted through the word lines WL1-WL4, which represent search data "HHLL", matches the stored encoded data "0011" (corresponding to 2-bit original data "00") in the memory units M(1,1)~M(1,4) of the memory cell C11. The threshold voltages of the memory units M(1,1)~M(1,4) are programmed as "H-Vt, H-Vt, L-Vt, L-Vt", and the memory units M(1,1)~M(1,4) will not be turned on by the search biases with voltage levels of "VS1, VS1, 0v, 0v". Therefore, the voltage level V-ML1 of the match signal line ML1 will not be pulled down to the second match voltage level VM2, and the sensing circuit 300 may sense that the voltage level V-ML1 is still maintained at the first match voltage level VM1 with higher voltage level. Accordingly, it's determined that the encoded data "0011" stored in the memory cell C11 matches the search data "HHLL". Similarly, the memory units M(1,5)~M(1,8) of the memory cell C12 will not be turned on by the search biases with voltage levels of "VS1, VS1, 0v, 0v", and the voltage level V-ML1 of the match signal line ML1 is still maintained at the first match voltage level VM1.

On the other hand, the four memory units M(n,1)~M(n,4) of the memory cell Cn1 in the n-th row may store the encoded data "0101", which does not match the search data "HHLL" inputted by the word lines WL1-WL4. The memory unit M(n,2) is programmed to have second threshold voltage L-Vt and can be turned on by search bias with first gate voltage level VS1 inputted through the word line WL2, hence the voltage level VM-n of the match signal line MLn can be pulled down to the second match voltage level VM2 through the turned-on memory unit M(n,2). When the sensing circuit 300 senses that the voltage level VM-n is smaller than the reference voltage Vref, it's determined that the stored data of the memory cell Cn1 does not match the search data. Similarly, the memory unit M(n,6) of the memory cell Cn2 can be turned on, and the voltage level VM-n can be pulled down to the second match voltage level VM2 through the memory unit M(n, 6).

Figure 11:
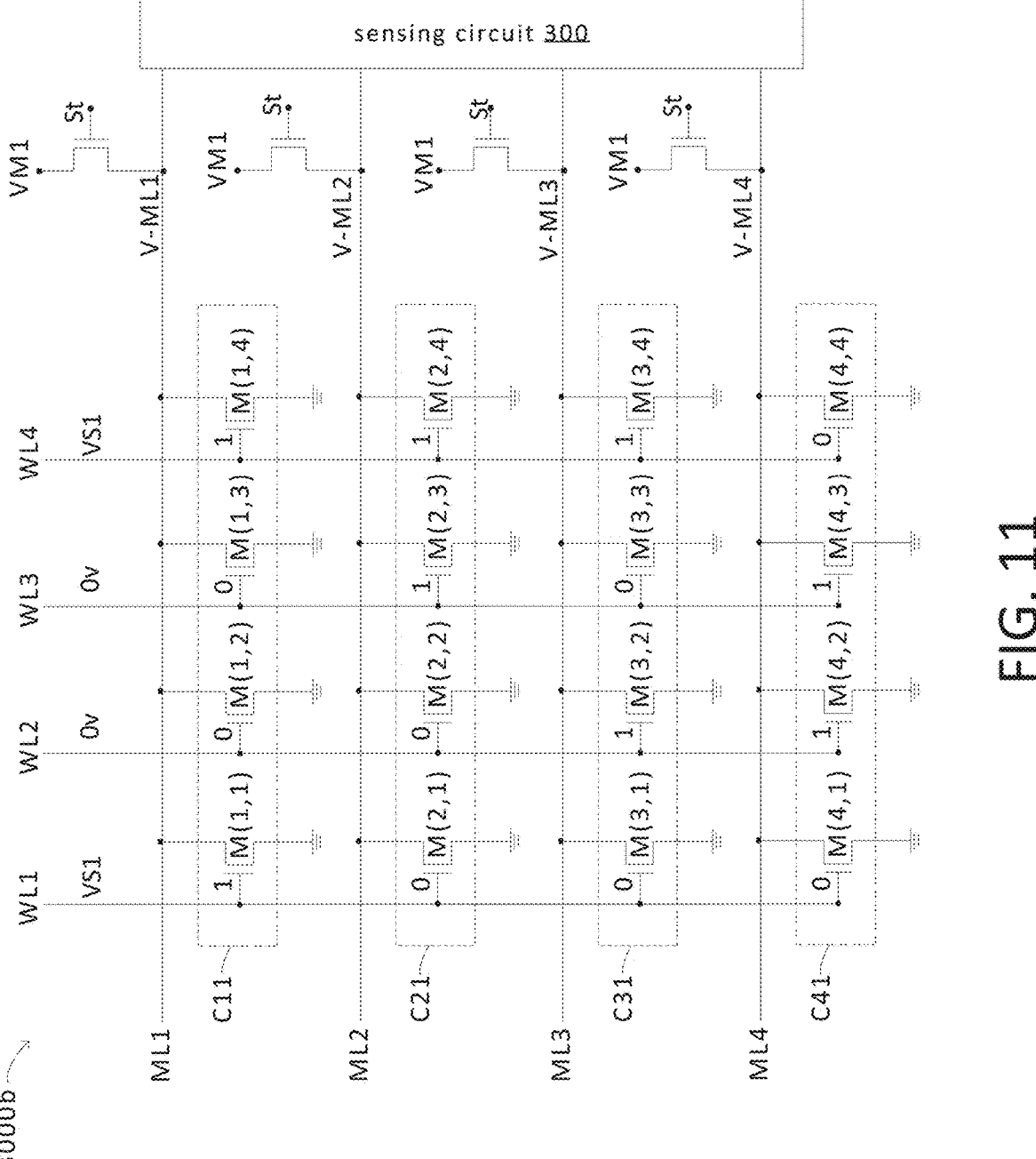
FIG. 11 is a circuit diagram of a NOR type memory device according to another embodiment of the disclosure.

FIG. 11 is a circuit diagram of a NOR type memory device 3000b according to another embodiment of the disclosure. The memory units C11, C21, C31 and C41 of the memory device 3000b are respectively coupled to the match signal lines ML1, ML2, ML3 and ML4. Each of the memory units C11, C21, C31 and C41 receives the search bias through the word lines WL1-WL4. The search biases of the word lines WL1~WL4 of the memory device 3000b may be inversely encoded. Table 3 shows the relationship between the stored original data and encoded data in the memory units of the memory device 3000b and the search bias inputted by the word lines. Wherein, the first gate voltage level VS1 of search bias in Table 2 is reversed to form the second gate voltage level VS2 (second gate voltage level VS2 may be represented as "0v") in Table 3, and vice-sersa.

TABLE 3

| Original data | | Encoded data | Search bias of word lines |
| --- | --- | --- | --- |
| decimal | binary | | |
| 0 | 00 | 0011 | 0v, 0v, VS1, VS1 |
| 1 | 01 | 0101 | 0v, VS1, 0v, VS1 |
| 2 | 10 | 0110 | 0v, VS1, VS1, 0v |
| 3 | 11 | 1001 | VS1, 0v, 0v, VS1 |
| 4 | — | 1010 | VS1, 0v, VS1, 0v |
| 5 | — | 1100 | VS1, VS1, 0v, 0v |
| 0~5 | | 0000 (don't care) | VS1, VS1, VS1, VS1 (wildcard) |
| Invalid data | | 1111 | 0v, 0v, 0v, 0v (invalid search) |

Figure 12:
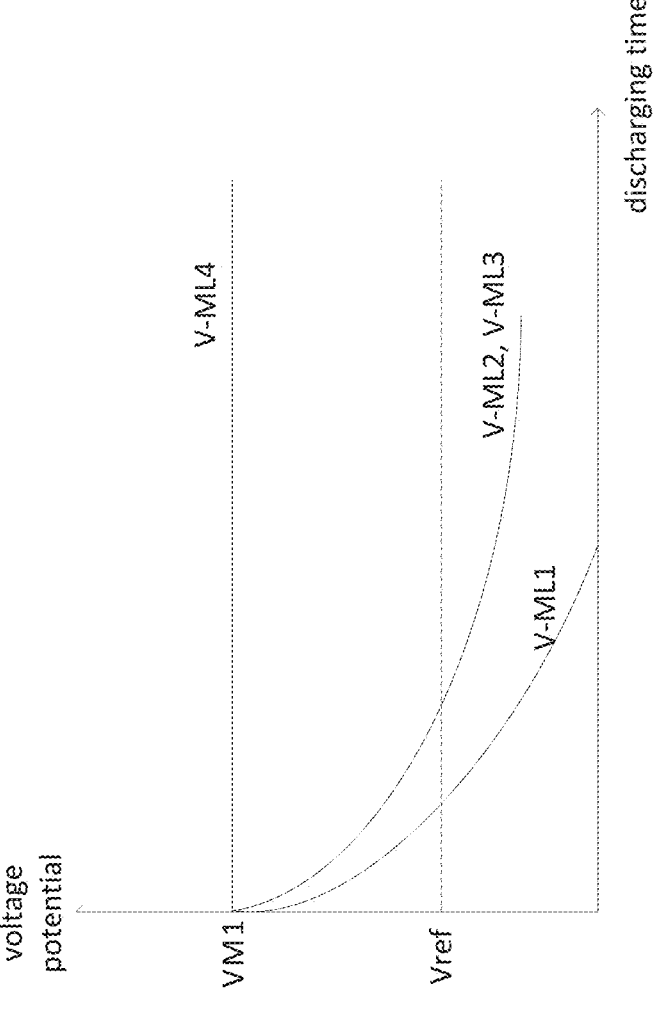
FIG. 12 is a timing diagram of the voltage level of the match signal line in another embodiment of the memory device of FIG. 9.

FIG. 12 is a timing diagram of the voltage levels V-ML1 to V-ML4 of the match signal lines ML1 to ML4 in another embodiment of the memory device 3000b of FIG. 9. Please refer to FIGS. 11 and 12 and Table 3, the encoded data "1001" stored in the memory cell C11 matches search biases with voltage levels of "VS1, 0v, 0v, VS1". The memory units M(1,1) and M(1,4) of the memory cell C11 have second threshold voltage L-Vt and can be turned on by the search bias with first gate voltage level VS1. Therefore, the voltage level V-ML1 of the match signal line ML1 may be rapidly pulled down to second match voltage level VM2 with the first discharging speed through the two turned-on memory units M(1,1) and M(1,4). The sensing circuit 300 can sense that the voltage level V-ML1 drops rapidly and gets smaller than the reference voltage Vref.

In addition, encoded data "0011" stored in the memory cell C21 does not match search biases with voltage levels of "VS1, 0v, 0v, VS1" partially, and the memory unit M(2,4) of the memory cell C21 has second threshold voltage L-Vt and can be turned on by the search bias with first gate voltage level VS1. Therefore, the voltage level V-ML2 of the match signal line ML2 is slowly pulled down to second match voltage level VM2 with a second discharging speed through only one memory unit M(2,4). The second discharging speed is smaller than the first discharging speed. Similarly, the encoded data "0101" stored in the memory cell C31 does not match search biases with voltage levels of "VS1, 0v, 0v, VS1" partially, and the memory unit M(3,4) of the memory cell C31 has second threshold voltage L-Vt and can be turned on by search bias with first gate voltage level VS1.

Therefore, the voltage level V-ML3 of the match signal line ML3 is slowly pulled down to second match voltage level VM2 at the second discharging speed through only one memory unit M(3,4).

On the other hand, the encoded data "0110" stored in the memory cell C41 completely mismatch search biases with voltage levels of "VS1, 0v, 0v, VS1", that is, each bit of the encoded data "0110" does not match corresponding search bias with voltage levels of "VS1, 0v, 0v, VS1". The memory units M(4,1)~M(4,4) of the memory cell C41 are not turned on, and the voltage level V-ML4 of the match signal line ML4 is still maintained at the first match voltage level VM1 which has a higher voltage level.

From the above, the memory device 3000b determines "degree of matching" between the stored data and search data of memory cells C11~C41 (i.e., how well the stored data matches search data) based on the time (i.e., the discharge time) during which the voltage levels V-ML1~V-ML4 of the match signal lines ML1-ML4 are pulled down to second match voltage level VM2.

Furthermore, in another embodiment (not shown in FIGS. 1-12) of the memory device 3000 of FIG. 9, the stored data of the memory cell may be reversely encoded, as shown in Table 4. The logical values of the encoded data in Table 4 and those in Table 2 are reversed.

TABLE 4

| Original data | | | |
|---|---|---|---|
| decimal | binary | Encoded data | Search bias of word lines |
| 0 | 00 | 1100 | VS1, VS1, 0v, 0v |
| 1 | 01 | 1010 | VS1, 0v, VS1, 0v |
| 2 | 10 | 1001 | VS1, 0v, 0v, VS1 |
| 3 | 11 | 0110 | 0v, VS1, VS1, 0v |
| 4 | — | 0101 | 0v, VS1, 0v, VS1 |
| 5 | — | 0011 | 0v, 0v, VS1, VS1 |
| 0~5 | | 1111 | 0v, 0v, 0v, 0v |
| | | (don't care) | (wildcard) |
| Invalid | | 0000 | VS1, VS1, VS1, VS1 |
| data | | | (invalid search) |

According to the memory devices in the above embodiments, the original data of M bits is encoded as the encoded data of 2N bits by an encoding mechanism, and encoded data of 2N bits may be stored in 2N memory units of a memory cell, so that density of stored content may be enhanced. The search bias can be inputted through the word lines or the bit lines and corresponds to search data, the search bias is used to search the encoded data stored in the NAND-type or NOR-type memory device. Furthermore, "degree of matching" between the encoded data and the search data can be determined.

It will be apparent to those skilled in the art that various modifications and variations can be made to disclosed embodiments. It is intended the specification and examples considered as exemplary only, with a true scope of the disclosure indicated by the following claims and their equivalents.

What is claimed is:

1. A memory device, comprising:
a first driving circuit;
a sensing circuit; and
an in-memory search (IMS) array, including a plurality of memory units, the memory units are arranged as a plurality of horizontal rows and a plurality of vertical columns, and a respective control terminal of each of the memory units in the same horizontal row is coupled to the first driving circuit through a corresponding word line, the memory units in the same horizontal row are coupled to the sensing circuit through a match signal line, wherein every 2N adjacent memory units in the same horizontal row are arranged as a memory cell, the 2N memory units in the memory cell are programmed to have a first threshold voltage or a second threshold voltage to represent an encoded data of 2N-bits which are encoded from an original data of M-bits, and M is equal to 2(N−1), where N and M are positive integers greater than or equal to two, and wherein the encoded data has a first encoded area including the first to N-th bits of the encoded data and a second encoded area including the (N+1)-th to 2N-th bits of the encoded data, and the M bits of the original data have an equivalent binary value increased by an incremental step which is P times of an incremental step for the N bits of the first encoded area, where P is a positive integer greater than or equal to two.

2. The memory device according to claim 1, wherein the encoded data has an encoding combinations number equal to $$\frac{(2N)!}{N! \times N!}.$$

3. The memory device according to claim 2, wherein the encoding combinations number of the encoded data is greater than or equal to "two to M-th power".

4. The memory device according to claim 1, wherein a corresponding one of the memory units is programmed to have the first threshold voltage or the second threshold voltage for storing a bit of logic value "0" or logic value "1" in the encoded data, and the first threshold voltage is greater than the second threshold voltage.

5. The memory device according to claim 4, wherein the first driving circuit is configured to apply a search bias to the corresponding memory unit through one of the word lines, the search bias has a first gate voltage level or a second gate voltage level matching the bit of logic value "0" or logic value "1" in the encoded data, the first gate voltage level of the search bias is greater than the second gate voltage level and the first threshold voltage, and the second gate voltage level is approximately equal to zero volts (0v).

6. The memory device according to claim 5, wherein when the search bias matches the bit in the encoded data, the corresponding match signal line maintains at first match voltage level, and when the search bias does not match the bit, the corresponding match signal line is pulled down to second match voltage level, the first match voltage level is greater than the second match voltage level.

7. The memory device according to claim 4, wherein the first driving circuit is configured to apply a search bias to the corresponding memory unit through one of the word lines, the search bias has a first gate voltage level or a second gate voltage level matching the bit of logic value "1" or logic value "0" in the encoded data, the first gate voltage level of the search bias is greater than the second gate voltage level and the first threshold voltage, and the second gate voltage level is approximately equal to zero volts (0v).

8. The memory device according to claim 7, wherein when the search bias matches the bit in the encoded data, the corresponding match signal line is pulled down to a second match voltage level with a first discharging speed, and when the search bias does not match the bit, the corresponding match signal line maintains at a first match voltage level or is pulled down to the second match voltage level with a second discharging speed, wherein the first match voltage level is greater than the second match voltage level, and the first discharging speed is greater than the second discharging speed.

9. An encoding method for a memory device, the memory device includes a first driving circuit, a sensing circuit and an in-memory search (IMS) array, the IMS array includes a plurality of memory units arranged as a plurality of horizontal rows and a plurality of vertical columns, a respective control terminal of each of the memory units in the same horizontal row is coupled to the first driving circuit through a corresponding word line, and the memory units in the same horizontal row are coupled to the sensing circuit through a match signal line, wherein every 2N adjacent memory units in the same horizontal row are arranged as a memory cell, and the encoding method comprising:

encoding an original data of M-bits to an encoded data of 2N-bits with a first encoded area and a second encoded area, the first encoded area includes the first to N-th bits of the encoded data, and the second encoded area includes the (N+1)-th to 2N-th bits of the encoded data, wherein the M bits of the original data have an equivalent binary value increased by an incremental step which is P times of an incremental step for the N bits of the first encoded area, and wherein N, M and P are positive integers greater than or equal to two, and M is equal to 2(N−1); and programming the 2N adjacent memory units in the memory cell to have a first threshold voltage or a second threshold voltage to represent the encoded data.

10. The encoding method according to claim 9, wherein the encoded data has an encoding combinations number equal to $$\frac{(2N)!}{N! \times N!}.$$

11. The encoding method according to claim 10, wherein the encoding combinations number of the encoded data is greater than or equal to "two to M-th power".

12. The encoding method according to claim 9, wherein the step of programming the 2N adjacent memory units in the memory cell comprising:

programming a corresponding one of the 2N adjacent memory units to have the first threshold voltage or the second threshold voltage to store a bit of logic value "0" or logic value "1" in the encoded data, wherein the first threshold voltage is greater than the second threshold voltage.

13. The encoding method according to claim 12, further comprising:

applying a search bias to the corresponding memory unit through one of the word lines by the first driving circuit, the search bias has a first gate voltage level or a second gate voltage level matching the bit of logic value "0" or logic value "1" in the encoded data, wherein the first gate voltage level of the search bias is greater than the second gate voltage level and the first threshold voltage, and the second gate voltage level is approximately equal to zero volts (0v).

14. The encoding method according to claim 13, wherein when the search bias matches the bit in the encoded data, the corresponding match signal line maintains at first match voltage level, and when the search bias does not match the bit, the corresponding match signal line is pulled down to second match voltage level, the first match voltage level is greater than the second match voltage level.

15. The encoding method according to claim 12, further comprising:

applying a search bias to the corresponding memory unit through one of the word lines by the first driving circuit, the search bias has a first gate voltage level or a second gate voltage level matching the bit of logic value "1" or logic value "0" in the encoded data, wherein the first gate voltage level of the search bias is greater than the second gate voltage level and the first threshold voltage, and the second gate voltage level is approximately equal to zero volts (0v).

16. The encoding method according to claim 15, wherein when the search bias matches the bit in the encoded data, the corresponding match signal line is pulled down to a second match voltage level with a first discharging speed, and when the search bias does not match the bit, the corresponding match signal line maintains at a first match voltage level or is pulled down to the second match voltage level with a second discharging speed, wherein the first match voltage level is greater than the second match voltage level, and the first discharging speed is greater than the second discharging speed.

*    *    *    *    *